(12) United States Patent
Hur (10) Patent No.: US 9,880,667 B2
(45) Date of Patent: Jan. 30, 2018

(54) TOUCH SCREEN DISPLAY DEVICE

(71) Applicant: Samsung Display Co., Ltd., Yongin, Gyeonggi-Do (KR)

(72) Inventor: Yong-Koo Hur, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/346,906

(22) Filed: Nov. 9, 2016

(65) Prior Publication Data

US 2017/0052645 A1  Feb. 23, 2017

Related U.S. Application Data

(63) Continuation of application No. 13/930,930, filed on Jun. 28, 2013, now abandoned.

(30) Foreign Application Priority Data

Jan. 30, 2013 (KR) ........................ 10-2013-0010522

(51) Int. Cl.
*G06F 3/041* (2006.01)
*G06F 3/044* (2006.01)
*H01L 27/32* (2006.01)

(52) U.S. Cl.
CPC ............ *G06F 3/0418* (2013.01); *G06F 3/044* (2013.01); *G06F 3/0412* (2013.01); *G06F 3/0416* (2013.01); *H01L 27/323* (2013.01); *G06F 2203/04104* (2013.01); *G06F 2203/04111* (2013.01); *H01L 2251/5338* (2013.01)

(58) Field of Classification Search
CPC ...................... G06F 3/044; G06F 3/045; G06F 3/046–3/47; G06F 2203/0338; G06F 2203/0339; G06F 2203/041; G06F 2203/04101; G06F 2203/04107; G06F 2203/04108; G06F 3/041; G06F 3/0412; G06F 3/0416; G06F 3/0418; G06F 2203/04104; G06F 2203/04111; G01L 27/3223; G01L 27/3225; H01L 27/323; H01L 2251/5338
USPC ................ 345/173–179, 104; 178/18, 18.03, 178/18.05–18.07, 19.03
See application file for complete search history.

(56) References Cited

U.S. PATENT DOCUMENTS

| | | | |
|---|---|---|---|
| 5,926,163 | A | 7/1999 | Nishimura |
| 7,907,126 | B2 | 3/2011 | Yoon et al. |
| 8,228,306 | B2 | 7/2012 | Long et al. |
| 2004/0263483 | A1 | 12/2004 | Aufderheide |

(Continued)

FOREIGN PATENT DOCUMENTS

| KR | 10-2011-0120219 A | 11/2011 |
|---|---|---|
| KR | 10-2012-0045288 A | 5/2012 |

*Primary Examiner* — Lun-Yi Lao
*Assistant Examiner* — Kelly Hegarty
(74) *Attorney, Agent, or Firm* — H.C. Park & Associates, PLC (57) ABSTRACT

A touch screen display device includes a first touch electrode, a second touch electrode and a conductive pattern. The first touch electrode receives a touch driving signal. The second touch electrode is positioned so as to be spaced apart from the first touch electrode. The conductive pattern is positioned so as to overlap with the first touch electrode, and receives a boost signal for boosting the touch driving signal. Accordingly, the touch driving signal is boosted, thereby improving touch sensitivity.

17 Claims, 4 Drawing Sheets

(56) References Cited

U.S. PATENT DOCUMENTS

| | | |
|---|---|---|
| 2005/0200293 A1* | 9/2005 | Naugler, Jr. ........ G06F 3/03542 315/149 |
| 2006/0022682 A1 | 2/2006 | Nakamura et al. |
| 2006/0208984 A1 | 9/2006 | Kim et al. |
| 2008/0055277 A1 | 3/2008 | Takenaka et al. |
| 2009/0115737 A1* | 5/2009 | Toyoshima ............. G06F 3/044 345/173 |
| 2009/0167720 A1 | 7/2009 | Geaghan |
| 2010/0001969 A1 | 1/2010 | Saito et al. |
| 2010/0052700 A1 | 3/2010 | Yano et al. |
| 2010/0079419 A1 | 4/2010 | Shibusawa |
| 2010/0315374 A1* | 12/2010 | Chen ....................... G06F 3/044 345/174 |
| 2011/0025635 A1 | 2/2011 | Lee |
| 2011/0128253 A1 | 6/2011 | Yoon et al. |
| 2011/0267295 A1 | 11/2011 | Noguchi et al. |
| 2012/0044166 A1* | 2/2012 | Mizuhashi ............ G06F 3/0412 345/173 |
| 2012/0105337 A1 | 5/2012 | Jun et al. |
| 2012/0146936 A1 | 6/2012 | Liu |
| 2012/0206403 A1 | 8/2012 | Wang et al. |
| 2012/0293428 A1 | 11/2012 | Yan |
| 2013/0076646 A1 | 3/2013 | Krah et al. |
| 2013/0241869 A1* | 9/2013 | Kida ....................... G06F 3/044 345/174 |
| 2013/0328800 A1* | 12/2013 | Pu .......................... G06F 3/041 345/173 |
| 2013/0342479 A1* | 12/2013 | Pyo ......................... G09G 3/00 345/173 |
| 2014/0198072 A1 | 7/2014 | Schuele et al. |
| 2014/0368467 A1* | 12/2014 | Park ..................... G06F 3/0412 345/174 |

\* cited by examiner

TOUCH SCREEN DISPLAY DEVICE

CLAIM OF PRIORITY

This application is filed under 35 U.S.C. § 120 as a continuation of U.S. patent application Ser. No. 13/930,930, filed on 28 Jun. 2013, which claims priority under 35 U.S.C. § 119 to and the benefit of Korean Patent Application No. 10-2013-0010522 filed in the Korean Intellectual Property Office on 30 Jan. 2013, the entire contents of which applications are incorporated herein by reference.

BACKGROUND OF THE INVENTION

Field of the Invention

The present invention relates to a touch screen display device, and more particularly, to a touch screen display device capable of improving touch sensitivity.

Description of the Related Art

A touch screen display device is a device that displays a screen and receives a user's command by recognizing contact of a hand or object with the screen.

Since the touch screen display device does not require a separate input device such as a keyboard or mouse, its application fields have been gradually extended.

Conventionally, the touch screen display device was manufactured using a method of separately producing a display device and a touch sensor and then attaching the touch sensor to the display device.

However, the method described above requires a process of forming the touch sensor separately from the display device, and therefore, it is inefficient in terms of process time and process cost. Accordingly, the integration of the touch sensor and the display device is required.

Meanwhile, a capacitive touch sensor has recently been widely used. This is because the capacitive touch sensor easily detects multi-touches and has excellent accuracy.

The capacitive touch sensor may be configured with a first touch electrode receiving a touch driving signal and a second touch electrode outputting a change in capacitance. In this case, a signal delay occurs in the touch driving signal, and therefore, the touch sensitivity of the touch sensor is lowered.

SUMMARY OF THE INVENTION

The present invention provides a touch screen display device capable of improving touch sensitivity by boosting a touch driving signal.

According to an aspect of the present invention, there is provided a touch screen display device, including: a first touch electrode receiving a touch driving signal; a second touch electrode positioned so as to be spaced apart from the first touch electrode; and a conductive pattern positioned so as to overlap with the first touch electrode, and receiving a boost signal for boosting the touch driving signal.

The boost signal may have a period in which the boost signal overlaps with the touch driving signal.

The boost signal may be supplied later than the touch driving signal.

The touch driving signal may be boosted by reflecting a variation in the voltage of the conductive pattern through capacitance formed between the first touch electrode and the conductive pattern.

The touch screen display device may further include a pixel receiving a scan signal, a data signal, and voltages of first and second power sources.

The conductive pattern may be a scan line through which the scan signal is supplied to the pixel.

The conductive pattern may be a data line through which the data signal is supplied to the pixel.

The conductive pattern may be a power source line through which the voltage of the first power source is supplied to the pixel.

The conductive pattern may be an anode electrode of an organic light emitting diode included in the pixel.

The first touch electrode may receive the touch driving signal during a first period, and may receive the voltage of the second power source during a second period.

The first and second periods may be alternately repeated.

The first touch electrode may supply the voltage of the second power source to the pixel.

The second touch electrode may intersect the first touch electrode.

The pixel may maintain a non-emission state during the first period.

The first and second touch electrodes may be formed of a transparent conductive material.

The touch screen display device may further include an insulation member interposed between the first and second touch electrodes.

As described above, according to the present invention, the touch driving signal is boosted, thereby improving touch sensitivity.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Furthermore, some of the elements that are not essential to a complete understanding of the invention are omitted for clarity. Also, like reference numerals refer to like elements throughout.

Figure 1:
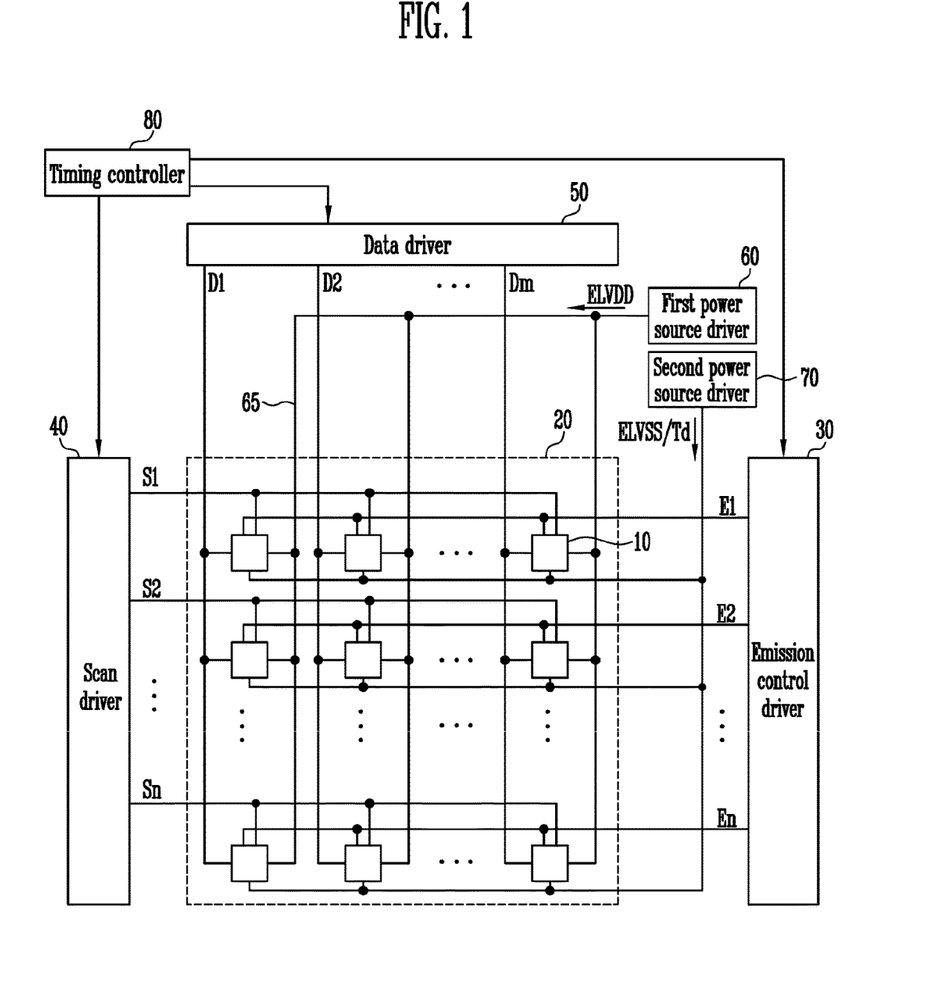
FIG. 1 is block diagram illustrating a touch screen display device according to an embodiment of the present invention.

FIG. 1 is block diagram illustrating a touch screen display device according to an embodiment of the present invention.

Referring to FIG. 1, the touch screen display device according to this embodiment of the invention may include a pixel unit 20, an emission control driver 30, a scan driver 40, a data driver 50, a first power source driver 60, a second power source driver 70 and a timing controller 80.

The pixel unit 20 may include a plurality of pixels 10 coupled to scan lines S1 to Sn, data lines D1 to Dm, control lines E1 to En, and a first power source line 65.

Each pixel 10 may receive a scan signal supplied through a scan line, receive a data signal supplied through a data line, and receive a control signal supplied through a control line.

Each pixel 10 may receive voltages respectively supplied from a first power source ELVDD driven by first power source driver 60 and from a second power source ELVSS driven by second power source driver 70.

In this case, each pixel 10 may generate light corresponding to the data signal by current flowing from the first power source ELVDD to the second power source ELVSS via an organic light emitting diode.

The emission control driver 30 may supply a control signal to each pixel 10 through the control lines E1 to En.

For example, the emission control driver 30 generates a control signal under the control of the timing controller 80, and outputs the generated control signal to the control lines E1 to En.

The control signal is used to control whether the pixel 10 emits light, and may include an emission signal and a non-emission signal.

For example, the pixel 10 receiving the emission signal may perform an emission operation, and the pixel 10 receiving the non-emission signal may perform a non-emission operation.

In FIG. 1, the emission control driver 30 is shown separately from the scan driver 40. However, the emission control driver 30 may be included in the scan driver 40.

The scan driver 40 may supply a scan signal to each pixel 10 through the scan lines S1 to Sn.

For example, the scan driver 40 generates a scan signal under the control of the timing controller 80, and outputs the generated scan signal to the scan lines S1 to Sn.

The data driver 50 may supply a data signal to each pixel 10 through the data lines D1 to Dm.

For example, the data driver 50 generates a data signal under the control of the timing controller 80, and outputs the generated data signal to the data lines D1 to Dm.

The first power source driver 60 may supply the voltage of the first power source ELVDD to each pixel 10 through the first power source line 65.

For example, the first power source driver 60 may be a DC-DC converter converting the voltage of power supplied from the outside thereof into the voltage of the first power source ELVDD.

The second power source driver 70 may supply the voltage of the second power source ELVSS to each pixel 10. In this case, the voltage of the second power source ELVSS may be provided to each pixel 10 through a first touch electrode 110 described later.

The second power source driver 70 may supply a touch driving signal Td to the first touch electrode 110.

The timing controller 80 may perform a function of controlling the emission control driver 30, the scan driver 40, the data driver 50, the first power source driver 60 and the second power source driver 70.

Figure 2:
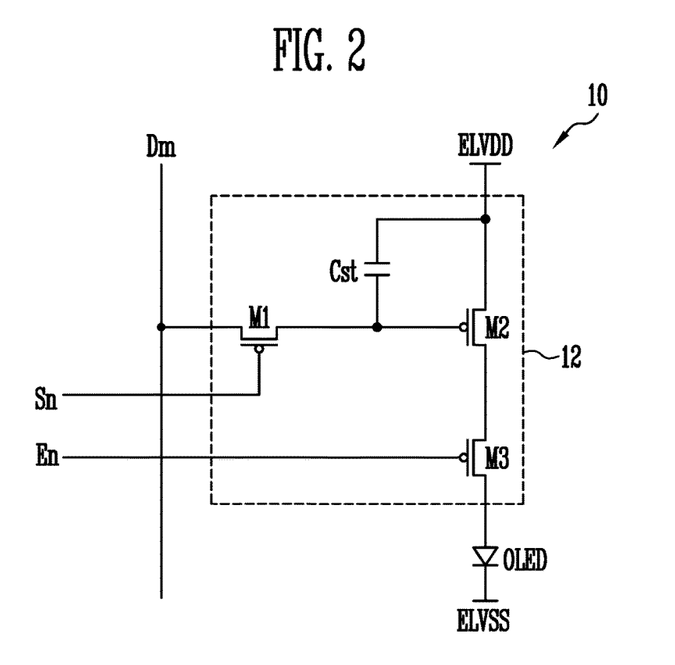
FIG. 2 is a circuit diagram illustrating one embodiment of a pixel shown in FIG. 1.

FIG. 2 is a circuit diagram illustrating one embodiment of the pixel shown in FIG. 1. Particularly, for convenience of illustration, a pixel coupled to an n-th scan line Sn, an m-th data line Dm and an n-th control line En is shown in FIG. 2.

Referring to FIG. 2, each pixel 10 includes an organic light emitting diode OLED, and a pixel circuit 12 coupled to the scan line Sn, the data line Dm and the control line En so as to control the amount of current flowing in the organic light emitting diode OLED.

The organic light emitting diode OLED may be coupled between the pixel circuit 12 and the second power source ELVSS.

For example, an anode electrode of the organic light emitting diode OLED may be coupled to the pixel circuit 12, and a cathode electrode of the organic light emitting diode OLED may be coupled to the second power source ELVSS.

The organic light emitting diode OLED may generate light with a predetermined luminance, corresponding to current supplied from the circuit pixel 12.

The pixel circuit 12 controls the amount of current supplied to the organic light emitting diode OLED in correspondence to a data signal supplied to the data line Dm when a scan signal is supplied to the scan line Sn.

For example, the pixel circuit 12 may include a first transistor M1 coupled between the data line Dm and the scan line Sn, a second transistor M2 coupled between the first power source ELVDD and a third transistor M3, and a storage capacitor Cst coupled between a gate electrode and a first electrode of the second transistor M2, the third transistor M3 being coupled between the second transistor M2 and the organic light emitting diode OLED.

A gate electrode of the first transistor M1 is coupled to the scan line Sn, and a first electrode of the first transistor M1 is coupled to the data line Dm.

A second electrode of the first transistor M1 is coupled to a first terminal of the storage capacitor Cst.

Here, the first electrode is set as any one of source and drain electrodes, and the second electrode is set as an electrode different from the first electrode. For example, if the first electrode is set as a source electrode, the second electrode is set as a drain electrode.

When a scan signal is supplied from the scan line Sn, the first transistor M1 coupled to the scan line Sn and the data line Dm is turned on to supply a data signal supplied from the data line Dm to the storage capacitor Cst. In this case, the storage capacitor Cst may charge a voltage corresponding to the data signal.

The gate electrode of the second transistor M2 is coupled to the first terminal of the storage capacitor Cst, and a first electrode of the second transistor M2 is coupled both to a second terminal of the storage capacitor Cst and to the first power source ELVDD. A second electrode of the second transistor M2 is coupled to a first electrode of the third transistor M3.

The second transistor M2 controls the amount of current flowing from the first power source ELVDD to the second power source ELVSS via the third transistor M3 and the organic light emitting diode OLED in correspondence to the voltage stored in the storage capacitor Cst. In this case, the organic light emitting diode OLED generates light corresponding to the amount of the current supplied from the second transistor M2 via the third transistor M3.

The first electrode of the third transistor M3 is coupled to the second transistor M2, and a second electrode of the third transistor M3 is coupled to the organic light emitting diode OLED. A gate electrode of the third transistor M3 is coupled to the control line En.

In this case, the third transistor M3 may be turned on when an emission signal is supplied to the control line En, and may be turned off when a non-emission signal is supplied to the control line En.

In a case where the third transistor M3 is turned on, pixel current supplied from the second transistor M2 may flow to the organic light emitting diode OLED, and thus the organic light emitting diode OLED can normally perform an emission operation.

In a case where the third transistor M3 is turned off, the pixel current supplied from the second transistor M2 does not flow to the organic light emitting diode OLED, and therefore, the organic light emitting diode OLED does not emit light.

The on-off operation of the third transistor M3 is controlled as described above, so that it is possible to control the emission or non-emission of each pixel 10.

The structure of the pixel described in FIG. 2 is merely one embodiment of the present invention, and therefore, the pixel 10 of the present invention is not limited to the structure of the pixel. Practically, the pixel circuit 12 has a circuit structure in which current can be supplied to the organic light emitting diode OLED, and may be selected as any one of various structures currently known in the art.

Figure 3:
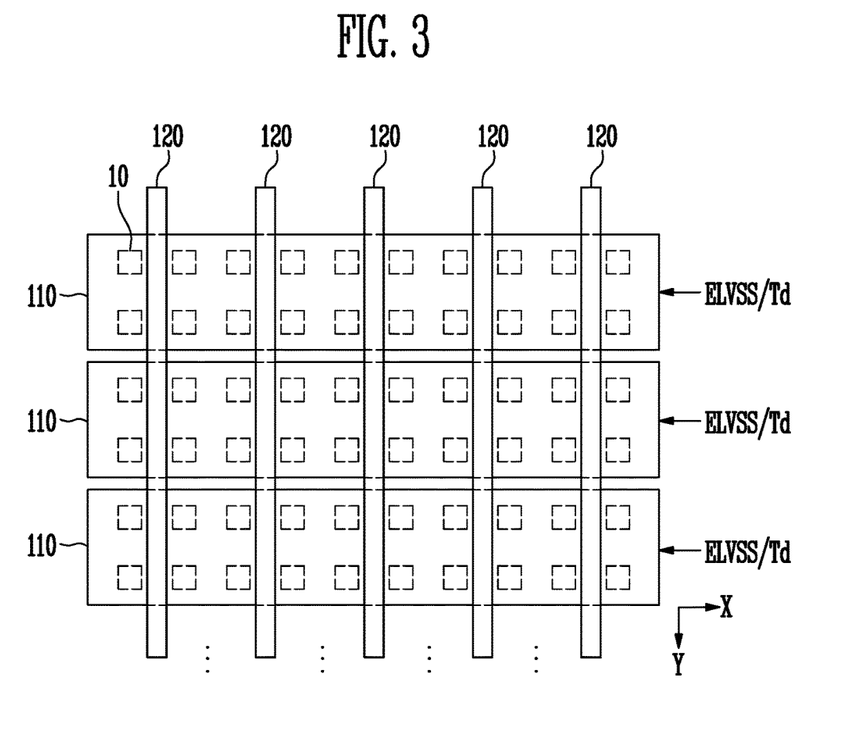
FIG. 3 is a view illustrating first and second touch electrodes of the touch screen display device according to the embodiment of the present invention.
Figure 4:
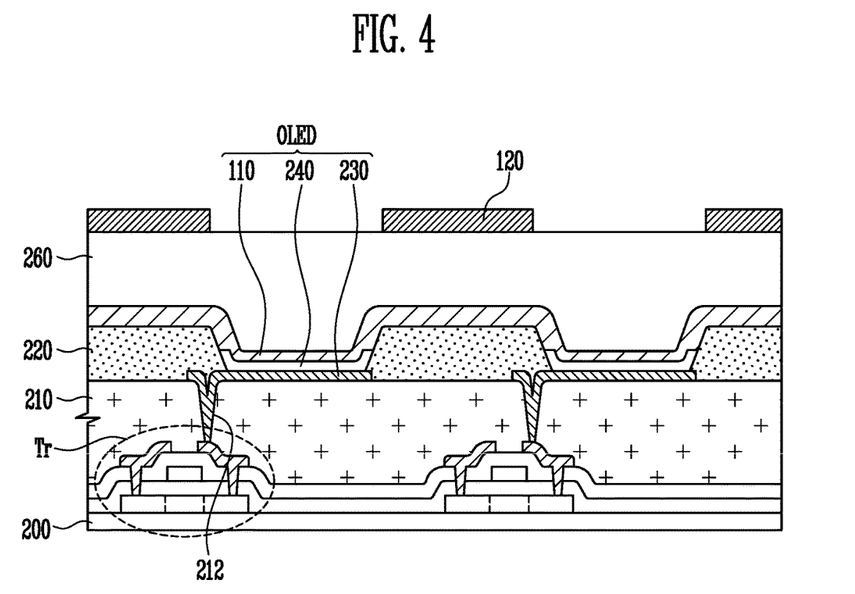
FIG. 4 is a main part sectional view of the touch screen display device according to the embodiment of the present invention.

FIG. 3 is a view illustrating first and second touch electrodes of the touch screen display device according to the embodiment of the present invention, and FIG. 4 is a main part sectional view of the touch screen display device according to the embodiment of the present invention.

The plurality of pixels 10 may be formed on a substrate 200. In this case, the substrate 200 may be made of a material having insulation properties, such as glass, plastic, silicon or synthetic resin.

The substrate 200 may be implemented with a film having flexibility so as to be bendable or foldable.

For convenience of illustration, only a transistor Tr directly coupled to the organic light emitting diode OLED is shown in FIG. 4.

For example, the transistor Tr may be the third transistor M3 of the pixel 10 shown in FIG. 2.

In addition, the transistors, the capacitor and the like, constituting the pixel circuit 12, may be positioned on the substrate 200. The scan lines S1 to Sn, the data lines D1 to Dm, the control lines E1 to En, the first power source line 65 and the like may be positioned on the substrate 200 of FIG. 4.

A planarization layer 210 may be positioned on the transistor Tr. The planarization layer 210 may be formed of an insulative material such as a nitride or oxide layer.

An anode electrode 230 coupled to the transistor Tr through a contact hole 212 may be positioned on the planarization layer 210. Accordingly, the anode electrode 230 can be coupled to the pixel circuit 12.

The anode electrode 230 may, together with an emission layer 240 and the first touch electrode 110, constitute the organic light emitting diode OLED.

A pixel defining layer 220 may be formed on the planarization layer 210 so that at least one region of the anode electrode 230 is exposed.

The pixel defining layer 220 may be made of one of an acryl-based organic compound, polyamide, and an organic insulative material such as polyimide. However, the present invention is not limited thereto. For example, the pixel defining layer 220 may be formed of various insulative materials.

The anode electrode 230 may be formed of various conductive materials, etc.

The emission layer 240 may be formed on the anode electrode 230 exposed to the outside through the pixel defining layer 220.

The emission layer 240 preferably includes an organic emission layer for self-emission.

In this case, the emission layer 240 may be formed into a structure in which a hole transporting layer, an organic emission layer and an electron transporting layer are stacked. The emission layer 240 may further include a hole injection layer and an electron injection layer.

The first touch electrode 110 may be positioned on the emission layer 240. Accordingly, the first touch electrode 110 can perform the function of the cathode electrode of the organic light emitting diode OLED.

Thus, a hole injected from the anode electrode 230 and an electron injected from the first touch electrode 110 are joined in the organic emission layer so as to generate an exciter, and light with a specific wavelength can be generated in each emission layer 240 by energy from the generated exciter.

In the touch screen display device according to this embodiment, the first touch electrode 110, divided into a plurality of pieces, may simultaneously perform the function of a cathode electrode receiving the voltage of the second power source ELVSS and the function of a touch driving electrode receiving the touch driving signal Td.

To this end, the first touch electrode 110 may time-divisionally receive the voltage of the second power source ELVSS for normal emission of the emission layer 240 and the touch driving signal Td for driving a touch sensor.

For example, the second power source driver 70 of FIG. 1 may supply the touch driving signal Td to the first touch electrode 110 during a first period, and may supply the voltage of the second power source ELVSS to the first touch electrode 110 during a second period. In this case, the first and second periods may be alternately repeated.

The first touch electrode 110 may be formed so as to be divided into a plurality of patterns as shown in FIG. 3.

For example, the first touch electrode 110 may be formed long in a first direction (e.g., an X-axis direction), and a plurality of first touch electrodes may be arranged along a second direction (e.g., a Y-axis direction) intersecting the first direction.

The first touch electrode 110 may be formed so as to be coupled to pixels 10 positioned on at least one row. In this case, the first touch electrode 110 may be coupled to the emission layer 240 (FIG. 4) of each pixel 10.

For example, as shown in FIG. 3, the first touch electrode 110 may be coupled to pixels 10 positioned on two rows.

The first touch electrode 110 is preferably formed of a transparent conductive material so that light emitted from the emission layer 240 is well transmitted therethrough. However, the first touch electrode 110 may be formed of another conductive material such as opaque metal.

For example, the first touch electrode 110 may be formed of indium tin oxide (ITO), indium zinc oxide (IZO), graphene, carbon nanotube, silver nanowires (AgNWs), etc.

Each first touch electrode 110 may overlap with at least one of a portion of the scan lines S1 to Sn, a portion of the data lines D1 to Dm, a portion of the control lines E1 to En, and a portion of the first power source line 65.

The second touch electrode 120 is positioned so as to be spaced apart from the first touch electrode 110, and so as to be driven, together with the first touch electrode 110, as a capacitive touch sensor.

To this end, the second touch electrode 120 may be positioned to intersect the first touch electrode 110.

For example, the second touch electrode 120 is formed long in the second direction (the Y direction in FIG. 3), and a plurality of second touch electrodes 120 may be arranged along the first direction (the X direction in FIG. 3).

Thus, mutual capacitance exists between the first and second touch electrodes 110 and 120, respectively, and a change in capacitance, caused by a touch, is sensed through the second touch electrode 120, thereby detecting a touch position.

In order to sense user's multi-touches, the touch driving signal Td may be progressively supplied to the plurality of first touch electrodes 110.

That is, the voltage of the second power source ELVSS may be normally supplied to the first touch electrode 110 during a period in which an image is displayed, and the touch driving signal Td may be supplied to the first touch electrode 110 during a period in which the touch is detected.

In this case, the second touch electrode 120 is preferably formed of a transparent conductive material, but may be formed of another conductive material such as opaque metal.

For example, the second touch electrode 120 may be formed of ITO, IZO, graphene, carbon nanotube, AgNWs, etc.

In a case where the second touch electrode 120 is formed of opaque metal so as to increase touch sensitivity by decreasing the resistance of the second touch electrode 120, the second touch electrode 120 is preferably positioned so as to overlap with the pixel defining layer 220 as shown in FIG. 4.

Accordingly, the second touch electrode 120 does not overlap with the emission layer 240, thereby improving visibility.

The first and second touch electrodes 110 and 120, respectively, are necessarily spaced apart from each other at a predetermined distance. To this end, an insulation member 260 may be interposed between the first and second touch electrodes 110 and 120, respectively.

In a case where the insulation member 260 is positioned on the first touch electrode 110 as shown in FIG. 4, the second touch electrode 120 may be positioned above the insulation member 260.

The insulation member 260 may be formed not only into a single-layered structure but also into a multi-layered structure.

Alternatively, the insulation member 260 may be positioned so as to be spaced apart from the first touch electrode 110. In this case, the second touch electrode 120 may be positioned below the insulation member 260.

Figure 5:
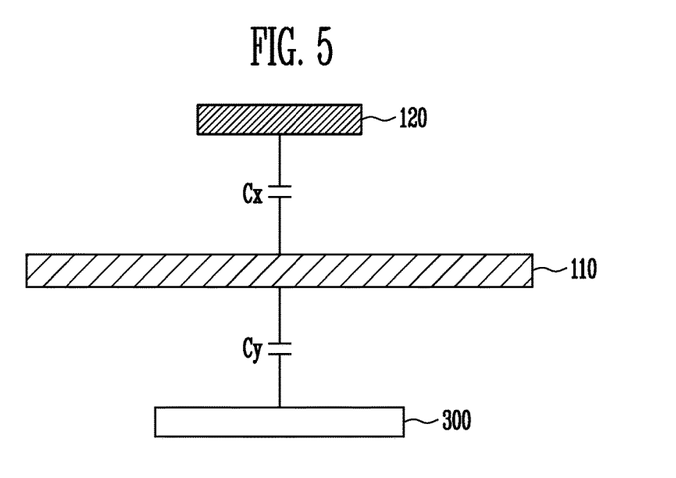
FIG. 5 is a view illustrating a conductive pattern of the touch screen display device according to the embodiment of the present invention.
Figure 6:
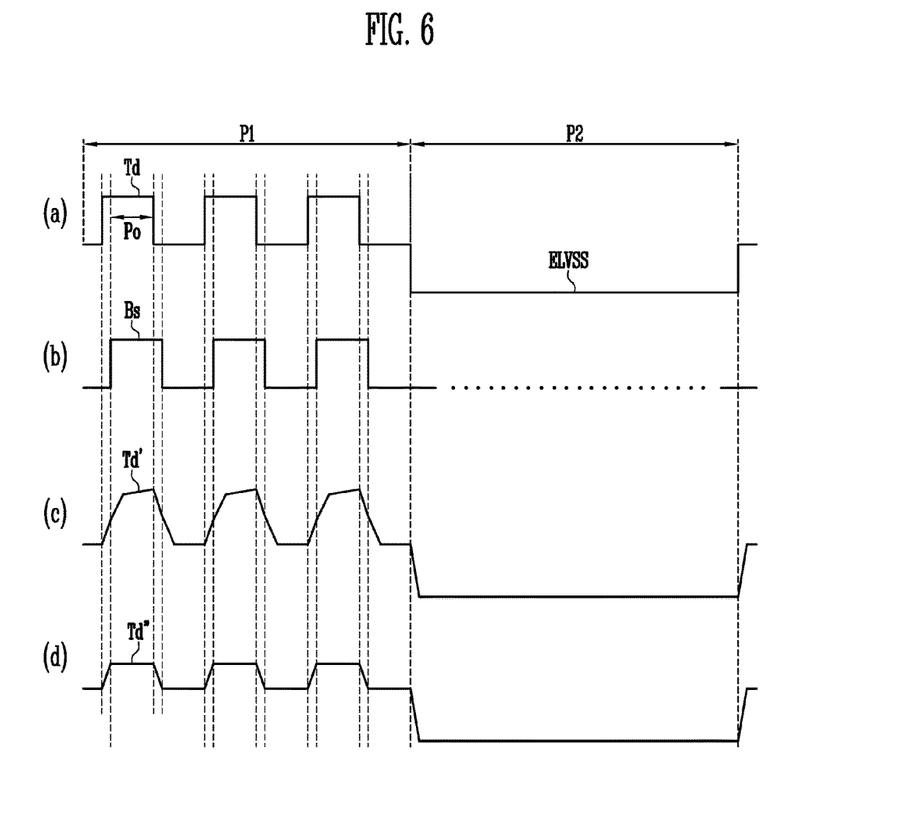
FIG. 6 is a waveform diagram illustrating a boosting operation of the touch screen display device according to the embodiment of the present invention.

FIG. 5 is a view illustrating a conductive pattern of the touch screen display device according to the embodiment of the present invention, and FIG. 6 is a waveform diagram illustrating a boosting operation of the touch screen display device according to the embodiment of the present invention.

Specifically, a touch driving signal Td supplied to the first touch electrode 110 is shown in FIG. 6(a), and a boost signal Bs is sown in FIG. 6(b). A touch driving signal Td', boosted by the boost signal Bs, is shown in FIG. 6(c), and a touch driving signal Td" in which a signal delay occurs when the boost signal Bs does not exist is shown in FIG. 6(d).

Referring to FIG. 5, the touch screen display device according to this embodiment may include a first touch electrode 110, a second touch electrode 120 and a conductive pattern 300.

The first touch electrode 110 may receive at least one touch driving signal Td so as to operate as a touch sensor.

The second touch electrode 120 may operate as a mutual capacitive touch sensor by being positioned so as to be spaced apart from the first touch electrode 110.

The first and second touch electrodes 110 and 120, respectively, have been previously described above, and therefore, their detailed descriptions will be omitted.

The conductive pattern 300 is positioned so as to overlap with the first touch electrode 110, and may receive the boost signal Bs for boosting the touch driving signal Td supplied to the first touch electrode 110.

The touch driving signal Td inputted from the second power source driver 70 of FIG. 1 to the first touch electrode 110 substantially has a form such as the touch driving signal Td" shown in FIG. 6(d) as a result of an RC delay generated in the first touch electrode 110.

Therefore, a desired touch sensitive cannot be implemented due to the signal delay of the touch driving signal Td.

In order to solve such a problem, in the present invention, the boost signal Bs may be supplied to the conductive pattern 300 positioned so as to overlap with the first touch electrode 110.

Since the first touch electrode 110 and the conductive pattern 300 are positioned so as to overlap with each other, a predetermined capacitance Cy is formed between the first touch electrode 110 and the conductive pattern 300.

That is, the first touch electrode 110 and the conductive pattern 300 may be configured as a kind of capacitor having the capacitance Cy. Accordingly, when the voltage of the conductive pattern 300 is changed, the voltage of the first touch electrode 110 is also changed.

As a result, the touch driving signal Td can be boosted to a predetermined voltage by reflecting a variation in the voltage of the boost signal Bs supplied to the conductive pattern 300 through the capacitance Cy formed between the first touch electrode 110 and the conductive pattern 300.

For example, if the voltage of the conductive pattern 300 is changed from low level to high level by the supply of the boost signal Bs, like the touch driving signal Td' shown in FIG. 6(c), the touch driving signal Td may be rapidly boosted to a voltage higher than that of the touch driving signal Td" shown in FIG. 6(d) by reflecting a variation in the voltage of the conductive pattern 300. Accordingly, the touch sensitivity of the touch screen display device can be improved.

In this case, the variation $\Delta V2$ in voltage generated in the first touch electrode 110 is changed depending on the variation $\Delta V1$ in voltage generated in the conductive pattern 300 as the boost signal Bs is supplied. The variation $\Delta V2$ may be expressed by the following equation.

$$\Delta V2 = \{Cy/(Cy+Cx)\} * \Delta V1$$

That is, as the size of the capacitance Cx formed between the first and second touch electrodes 110 and 120, respectively, is decreased, the variation $\Delta V2$ in the voltage generated in the first touch electrode 110 is increased. Therefore, the size of the capacitance Cx is preferably designed to be as small as possible.

To this end, the width of the second touch electrode 120 is preferably designed to be as narrow as possible.

For example, the width of the second touch electrode 120 may be designed to be narrower than that of the conductive pattern 300.

In this case, the boost signal Bs and the touch driving signal Td, supplied to the conductive pattern 300, preferably have a mutually overlapping period Po.

The boost signal Bs is preferably supplied later than the touch driving signal Td.

For example, after the voltage of the first touch electrode 110 is changed from the low level to the high level, the voltage of the conductive pattern 300 may be changed from the low level to the high level.

After voltage of the first touch electrode 110 is changed from the high level to the low level, the voltage of the conductive pattern 300 may be changed from the high level to the low level.

The first period P1 of FIG. 6 is a period in which the first touch electrode 110 operates, together with the second touch electrode 120, as a touch sensor. The first touch electrode 110 may receive the touch driving signal Td during the first period P1.

The second period P2 is a period in which the pixel 10 emits light. The first touch electrode 110 may receive the voltage of the second power source ELVSS for normal emission of the pixel during the second period P2.

To this end, the second power source driver 70 may supply the touch driving signal Td to the first touch electrode 110 during the first period P1, and may supply the voltage of the second power source ELVSS to the first touch electrode 110 during the second period P2.

The first and second periods P1 and P2, respectively, may be alternately repeated.

In a case where the touch driving signal Td is supplied to the first touch electrode 110, the pixel 10 cannot normally emit light. Therefore, the pixel 10 is preferably maintained in a non-emission state during the first period P1.

Various types of wires and electrodes used in the touch screen display device according to this embodiment may be used as the conductive pattern 300.

As an example, the conductive pattern 300 may be a scan line positioned so as to overlap with the first touch electrode 110.

In this case, the scan driver 40 may supply the boost signal Bs to at least one scan line overlapping with the first touch electrode 110 to which the touch driving signal Td is supplied during the first period P1.

The scan driver 40 may perform an operation of supplying a scan signal to the scan lines S1 to Sn during the second period P2.

As another example, the conductive pattern 300 may be a data line positioned so as to overlap with the first touch electrode 110.

In this case, the data driver 50 may supply the boost signal Bs to at least one data line overlapping with the first touch electrode 110 to which the touch driving signal Td is supplied during the first period P1.

The data driver 50 may perform an operation of supplying a data signal to the data lines D1 to Dm during the second period P2.

As still another example, the conductive pattern 300 may be the first power source line 65 positioned so as to overlap with the first touch electrode 110.

In this case, the first power source driver 60 may supply the boost signal Bs to at least one first power source line 65 overlapping with the first touch electrode 110 to which the touch driving signal Td is supplied during the first period P1.

The first power source driver 60 may perform an operation of supplying the voltage of the first power source ELVDD to the first power source line 65 during the second period P2.

As still another example, the conductive pattern 300 may be the anode electrode 230 positioned so as to overlap with the first touch electrode 110.

In this case, a separate driver may supply the boost signal Bs to the anode electrode 230 overlapping with the first touch electrode 110 to which the touch driving signal Td is supplied during the first period P1.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A touch screen display device, comprising:
   a first touch electrode receiving a touch driving signal;
   a second touch electrode positioned so as to be spaced apart from the first touch electrode; and
   a conductive pattern positioned so as to overlap with the first touch electrode, and receiving a boost signal for boosting the touch driving signal,
   wherein the boost signal is supplied later than the touch driving signal.

2. The touch screen display device of claim 1, wherein the boost signal has a period in which the boost signal overlaps with the touch driving signal.

3. The touch screen display device of claim 1, wherein a voltage of the conductive pattern is changed from low level to high level after a voltage of the first touch electrode is changed from low level to high level.

4. The touch screen display device of claim 1, wherein the touch driving signal is boosted by reflecting a variation in a voltage of the conductive pattern through a capacitance formed between the first touch electrode and the conductive pattern.

5. The touch screen display device of claim 1, further comprising a pixel receiving a scan signal, a data signal, and voltages of first and second power sources.

6. The touch screen display device of claim 5, wherein the conductive pattern is a scan line through which the scan signal is supplied to the pixel.

7. The touch screen display device of claim 5, wherein the conductive pattern is a data line through which the data signal is supplied to the pixel.

8. The touch screen display device of claim 5, wherein the conductive pattern is a power source line through which the voltage of the first power source is supplied to the pixel.

9. The touch screen display device of claim 5, wherein the conductive pattern is an anode electrode of an organic light emitting diode included in the pixel.

10. The touch screen display device of claim 5, wherein the first touch electrode receives the touch driving signal during a first period, and receives the voltage of the second power source during a second period.

11. The touch screen display device of claim 10, wherein the first and second periods are alternately repeated.

12. The touch screen display device of claim 10, wherein the first touch electrode supplies the voltage of the second power source to the pixel.

13. The touch screen display device of claim 10, wherein the pixel maintains a non-emission state during the first period.

14. The touch screen display device of claim 1, wherein the second touch electrode intersects the first touch electrode.

15. The touch screen display device of claim 1, wherein the first and second touch electrodes are formed of a transparent conductive material.

16. The touch screen display device of claim 1, further comprising an insulation member interposed between the first and second touch electrodes.

17. The touch screen display device of claim 1, wherein the touch driving signal and the boost signal have high level voltages, respectively.

* * * * *